United States Patent
Wang et al.

(10) Patent No.: US 11,812,640 B2
(45) Date of Patent: *Nov. 7, 2023

(54) DISPLAY SUBSTRATE HAVING A PROJECTION OF THE DISPLAY LAYER LOCATED WITHIN A PROJECTION OF A LIGHT SHIELDING LAYER, DISPLAY DEVICE AND TRANSPARENT DISPLAY INCLUDING THE SAME

(71) Applicant: BOE TECHNOLOGY GROUP CO., LTD., Beijing (CN)

(72) Inventors: Hejin Wang, Beijing (CN); Mingche Hsieh, Beijing (CN); Pinfan Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 53 days.

This patent is subject to a terminal disclaimer.

(21) Appl. No.: 17/522,507

(22) Filed: Nov. 9, 2021

(65) Prior Publication Data

US 2022/0069041 A1 Mar. 3, 2022

Related U.S. Application Data

(63) Continuation of application No. 16/571,570, filed on Sep. 16, 2019, now Pat. No. 11,189,672.

(30) Foreign Application Priority Data

Sep. 30, 2018 (CN) .......................... 201811161433.X (51) Int. Cl.
*H10K 59/122* (2023.01)
*H10K 59/126* (2023.01)
*H10K 59/131* (2023.01)

(52) U.S. Cl.
CPC ......... *H10K 59/122* (2023.02); *H10K 59/126* (2023.02); *H10K 59/131* (2023.02)

(58) Field of Classification Search
CPC ... H10K 59/122; H10K 59/131; H10K 59/126
See application file for complete search history.

(56) References Cited

U.S. PATENT DOCUMENTS

| 9,306,190 B2 | 4/2016 | Kim et al. |
| 11,189,672 B2 * | 11/2021 | Wang ................... H10K 59/126 |

(Continued)

FOREIGN PATENT DOCUMENTS

| CN | 1550857 A | 12/2004 |
| CN | 203456471 U | 2/2014 |
| CN | 106711179 A | 5/2017 |
| CN | 107170791 A | 9/2017 |
| CN | 107195659 A | 9/2017 |

(Continued)

OTHER PUBLICATIONS

"First Office Action and English language translation, CN Application No. 201811161433.X, dated Mar. 16, 2020, 29 pp."

(Continued)

*Primary Examiner* — Lex H Malsawma
(74) *Attorney, Agent, or Firm* — Myers Bigel, P.A.

(57) ABSTRACT

An OLED substrate is provided, which comprises a light emitting region and a transparent region, wherein the OLED substrate comprises a substrate and a display layer on the substrate, and a portion of the display layer located in the transparent region has a first hollow part. A method for manufacturing an OLED substrate and a transparent display comprising an OLED substrate are further provided.

20 Claims, 6 Drawing Sheets

(56) References Cited

U.S. PATENT DOCUMENTS

| | | |
|---|---|---|
| 2004/0189919 A1 | 9/2004 | Ahn et al. |
| 2009/0140283 A1 | 6/2009 | Kawakami et al. |
| 2011/0169720 A1 | 7/2011 | Hwang et al. |
| 2012/0169683 A1 | 7/2012 | Hong |
| 2013/0256638 A1 | 10/2013 | Uesugi et al. |
| 2014/0183479 A1 | 7/2014 | Park et al. |
| 2016/0064411 A1 | 3/2016 | Park et al. |
| 2016/0126494 A1 | 5/2016 | Jung et al. |
| 2016/0172633 A1* | 6/2016 | Ahn .................... H10K 59/128 257/40 |
| 2016/0351645 A1 | 12/2016 | You et al. |
| 2017/0148861 A1 | 5/2017 | Kim |
| 2019/0235680 A1 | 8/2019 | Ma et al. |
| 2019/0296055 A1 | 9/2019 | Lius et al. |
| 2020/0117034 A1 | 4/2020 | Yin et al. |
| 2021/0202537 A1 | 7/2021 | Cao et al. |

FOREIGN PATENT DOCUMENTS

| | | |
|---|---|---|
| CN | 206505399 U | 9/2017 |
| CN | 107359268 A | 11/2017 |
| CN | 107946321 A | 4/2018 |
| CN | 108269856 A | 7/2018 |
| CN | 207602574 U | 7/2018 |

OTHER PUBLICATIONS

"Non-Final Office Action", U.S. Appl. No. 16/571,570, dated Apr. 1, 2021, 12 pp.

"Rejection Decision and English language translation", CN Application No. 201811161433.X, Feb. 20, 2021, 27 pp.

"Second Office Action and English language translation", CN Application No. 201811161433.X, dated Aug. 26, 2020, 25 pp.

\* cited by examiner

DISPLAY SUBSTRATE HAVING A PROJECTION OF THE DISPLAY LAYER LOCATED WITHIN A PROJECTION OF A LIGHT SHIELDING LAYER, DISPLAY DEVICE AND TRANSPARENT DISPLAY INCLUDING THE SAME

CROSS-REFERENCE TO RELATED APPLICATIONS

The present application is a Continuation application of Ser. No. 16/571,570, filed on Sep. 16, 2019 and entitled "TRANSPARENT DISPLAY WITH OLED SUBSTRATE HAVING MULTIPLE HOLLOW PARTS AND MANUFACTURING METHOD THEREOF", which claims the benefit of Chinese Patent Application No. 201811161433.X, filed on Sep. 30, 2018, the entire disclosure of which is incorporated herein by reference.

FIELD

The present disclosure relates to the field of display technologies, and especially to an OLED substrate, a method for manufacturing an OLED substrate, and a transparent display.

BACKGROUND

With the rapid development of science and technology, a variety of novel technologies are emerging. Transparent displays among them have received more and more attention due to their unique performance.

SUMMARY

An aspect of the present disclosure provides an OLED substrate comprising a light emitting region and a transparent region, wherein the OLED substrate comprises a substrate and a display layer on the substrate, and a portion of the display layer in the transparent region has a first hollow part.

According to some exemplary embodiments of the present disclosure, the substrate comprises a base substrate and a transparent etch barrier layer between the base substrate and the display layer.

According to some exemplary embodiments of the present disclosure, the substrate comprises a base substrate and a light shielding layer between the base substrate and the display layer, and wherein a portion of the light shielding layer in the transparent region has a second hollow part, an orthographic projection of the first hollow part on the base substrate at least partially overlaps an orthographic projection of the second hollow part on the base substrate.

According to some exemplary embodiments of the present disclosure, the orthographic projection of the first hollow part on the base substrate coincides with the orthographic projection of the second hollow part on the base substrate.

According to some exemplary embodiments of the present disclosure, the orthographic projection of the second hollow part on the base substrate is within the orthographic projection of the first hollow part on the base substrate.

According to some exemplary embodiments of the present disclosure, the above OLED substrate further comprises a transparent etch barrier layer between the light shielding layer and the display layer.

According to some exemplary embodiments of the present disclosure, the light shielding layer comprises one or more of a black resin layer and a metal layer.

According to some exemplary embodiments of the present disclosure, the light shielding layer comprises a metal layer and the etch barrier layer comprises a transparent conductive layer.

According to some exemplary embodiments of the present disclosure, the display layer comprises a buffer layer, a thin film transistor, a planarization layer, a light emitting device, and a pixel defining layer in sequence on the substrate.

According to some exemplary embodiments of the present disclosure, the OLED substrate comprises a plurality of pixel units arranged in a matrix, each pixel unit of the plurality of pixel units comprises at least one sub-pixel unit, each sub-pixel unit of the at least one sub-pixel unit comprises a light emitting sub-region and a transparent sub-region, all light emitting sub-regions constitute the light emitting region, and all transparent sub-regions constitute the transparent region.

According to some exemplary embodiments of the present disclosure, the OLED substrate comprises a plurality of pixel units arranged in a matrix, each pixel unit of the plurality of pixel units comprises at least one sub-pixel unit, all sub-pixel units constitute the light emitting region, and regions among the plurality of pixel units constitute the transparent region.

According to some exemplary embodiments of the present disclosure, the above OLED substrate further comprises wirings on the light shielding layer, wherein the wirings are formed of a same material in a same layer as at least one layer of the display layer. Another aspect of the present disclosure provides a transparent display comprising any of the OLED substrates described above and a package layer on the OLED substrate.

According to some exemplary embodiments of the present disclosure, the package layer comprises one of a substrate package layer and a thin film package layer.

A further aspect of the present disclosure provides a method for manufacturing an OLED substrate, the OLED substrate comprising a light emitting region and a transparent region, the method comprising: providing a substrate; forming a display layer on the substrate; and forming a first hollow part in a portion of the display layer in the transparent region.

According to some exemplary embodiments of the present disclosure, the first hollow part is formed by an etching process, and wherein said providing a substrate comprises: providing a base substrate; and forming a transparent etch barrier layer on the base substrate.

According to some exemplary embodiments of the present disclosure, said providing a substrate comprises: providing a base substrate; forming a light shielding layer on the base substrate; and forming a second hollow part in a portion of the light shielding layer in the transparent region, an orthographic projection of the first hollow part on the base substrate at least partially overlapping an orthographic projection of the second hollow part on the base substrate.

According to some exemplary embodiments of the present disclosure, the orthographic projection of the second hollow part on the base substrate is within the orthographic projection of the first hollow part on the base substrate.

According to some exemplary embodiments of the present disclosure, said forming a display layer on the substrate comprises: forming a buffer layer, a thin film transistor, a planarization layer, a light emitting device, and a pixel defining layer on the substrate successively.

According to some exemplary embodiments of the present disclosure, the above method further comprises forming wirings on the light shielding layer, wherein the wirings are formed simultaneously with at least one layer of the display layer.

BRIEF DESCRIPTION OF THE DRAWINGS

In order to illustrate the embodiments of the present disclosure or the technical solutions in related art more clearly, the drawings to be used for description of the embodiments or the related art will be briefly described below. It is apparent that the drawings in the description below are only some of the embodiments of the present disclosure, and other drawings may be further obtained by a person having an ordinary skill in the art based on these drawings without spending inventive efforts.

DETAILED DESCRIPTION

The technical solutions in embodiments of the present disclosure will be clearly and completely described below with reference to the accompanying drawings. It is obvious that the described embodiments are only a part of the embodiments of the present disclosure, rather than all of them. All other embodiments obtained by a person having an ordinary skill in the art based on the embodiments of the present disclosure without spending inventive efforts fall within the scope of the present disclosure.

Figure 1:
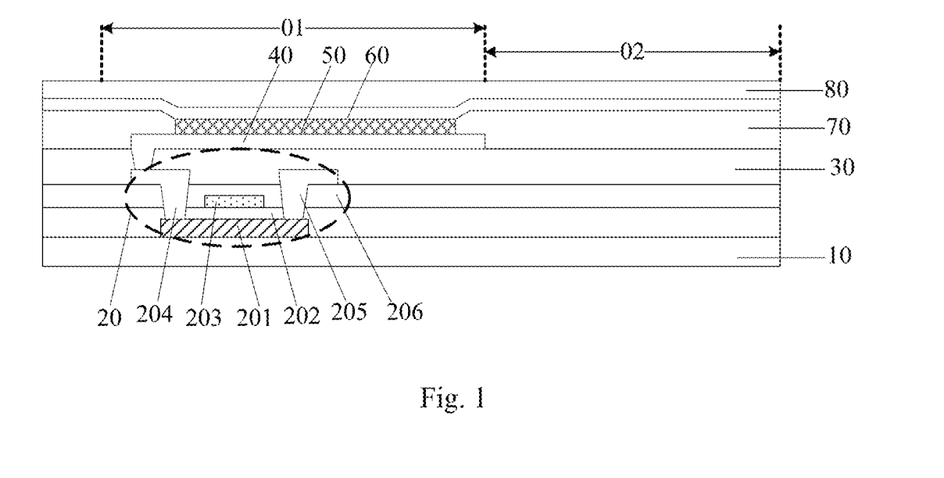
FIG. 1 is a schematic structural view of a transparent display provided by the related art.

Generally, a transparent display refers to a display which has a certain degree of light penetrability. For example, as shown in FIG. 1, the transparent display comprises both a light emitting region 01 and a transparent region 02. An important indicator for determining the performance of a transparent display panel is the transmittance of the transparent region 02, because its transmittance determines how much light can pass through the display panel, thereby affecting the brightness of an image acquired through the transparent region 02. However, as shown in FIG. 1, since film layers in the transparent display such as a gate insulating layer (GI) 202 and an interlayer dielectric layer (ILD) 206 in a thin film transistor (TFT) 20, a planarization layer 30, a pixel defining layer 70, and the like have low transmittance, and light will be reflected and refracted when passing through these film layers, the light transmittance of the transparent display is decreased, thereby degrading the user experience.

Figure 2:
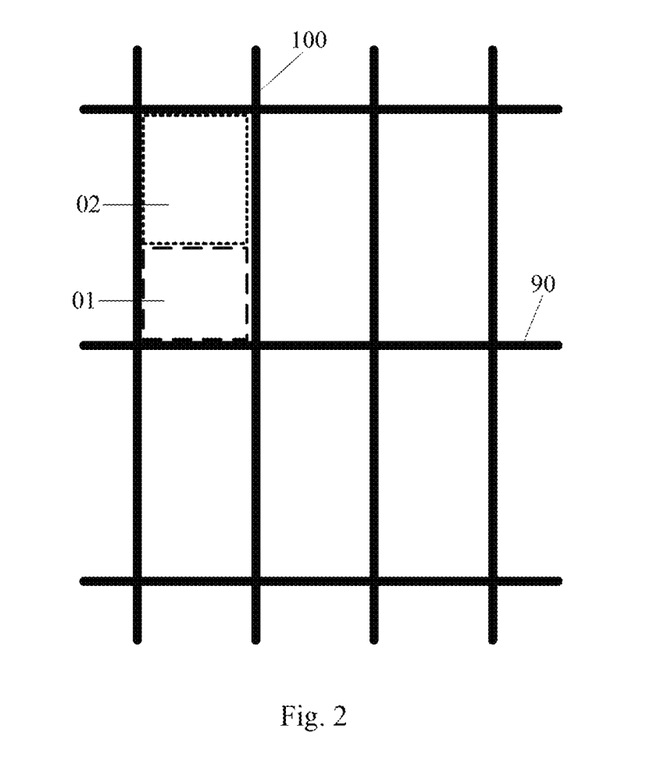
FIG. 2 is a schematic structural view of one sub-pixel region of a transparent display comprising a light emitting region and a transparent region provided by the related art.

Specifically, in the related art, a transparent organic light emitting display (OLED) comprises an OLED substrate comprising a light emitting region and a transparent region. The transparent region in the OLED substrate can be designed in the OLED substrate as needed. For example, as shown in FIG. 2, gate lines 90 and data lines 100 which intersect with each other enclose a plurality of sub-pixel regions, and one sub-pixel region is divided into a light emitting region 01 and a transparent region 02. Alternatively, it is also possible to arrange a transparent region every other pixel region (one pixel region comprises one or more sub-pixel regions, and the one or more sub-pixel region are the light emitting region).

Figure 3:
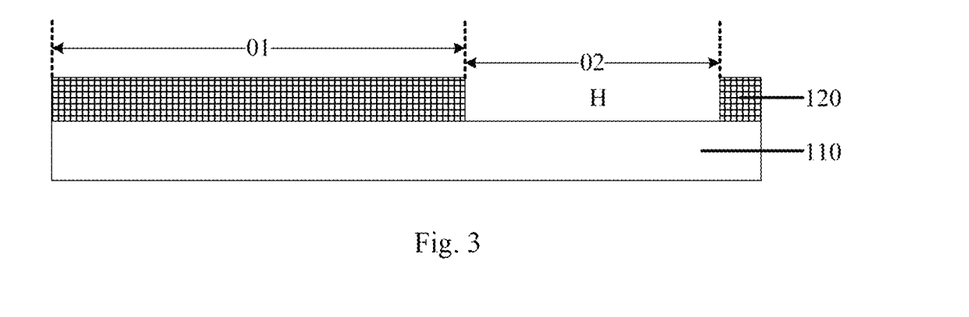
FIG. 3 is a schematic structural view of an OLED substrate provided by an embodiment of the present disclosure.

An embodiment of the present disclosure provides an OLED substrate that contributes to an improved transparent display effect. As shown in FIG. 3, the OLED substrate comprises a light emitting region 01 and a transparent region 02. The OLED substrate comprises a substrate 110 and a display layer 120 located on the substrate 110, wherein a portion of the display layer 120 located in the transparent region 02 has a first hollow part H.

It is to be noted that the substrate 110 refers to a structure under the display layer that realizes the display function in the OLED substrate, which may comprise a base substrate only, and may also comprise a base substrate and other film layers located between the base substrate and the display layer.

As used herein, a portion of the display layer 120 located in the transparent region 02 has a first hollow part H, which may mean that the portion of the display layer 120 located in the transparent region 02 is completely hollowed out, that is, the portion of the display layer 120 located in the transparent region 02 is completely removed, and may also mean that the portion of the display layer 120 located in the transparent region 02 is partially hollowed out, that is, the portion of the display layer 120 located in the transparent region 02 is partially removed, while other portions are retained.

In the above-described OLED substrate provided by an embodiment of the present disclosure, since the portion of the display layer 120 located in the transparent region 02 has the first hollow part H, loss of light caused by the display layer 120 when the light passes through the first hollow part H is avoided, so that the transmittance of light is enhanced when the light passes through the transparent region 02 of the OLED substrate. In case the above-described OLED substrate is applied to an OLED transparent display, the light transmittance of the transparent display is enhanced such that the brightness of an image acquired through the transparent region is increased, thereby improving the user experience.

Figure 4:
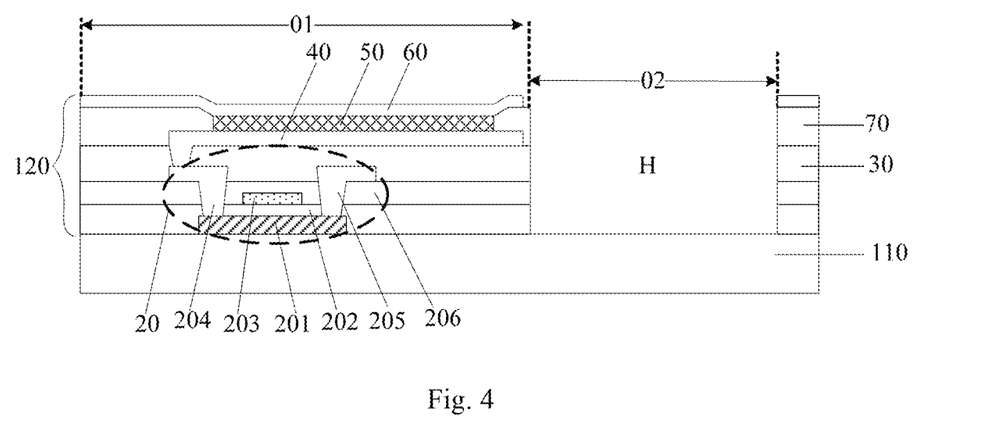
FIG. 4 is a schematic structural view of an OLED substrate provided by an embodiment of the present disclosure.

Specifically, as shown in FIG. 4, the display layer 120 may include, but is not limited to, a thin film transistor 20, a light emitting device, and a pixel defining layer 70. The thin film transistor 20 comprises an active layer 201, a gate insulating layer 202, a gate 203, an interlayer dielectric layer 206, a first terminal 205, and a second terminal 204. The second terminal 204 and the first terminal 205 are both connected to the active layer. The pixel defining layer 70 has a plurality of openings such that the light emitting device is disposed in a respective one of the openings. The light emitting device comprises an anode 40, a cathode 60, and a light emitting functional layer 50 sandwiched between the anode 40 and the cathode 60. The second terminal 204 of the thin film transistor 20 is electrically connected to the anode 40 of the light emitting device, thereby driving the light emitting device to emit light. The light emitting functional layer 50 of the light emitting device comprises a light emitting layer, and optionally, at least one of an electron transport layer, an electron injection layer, a hole transport layer, and a hole injection layer.

Further, as shown in FIG. 4, the display layer 120 may further comprise a planarization layer 30 which is disposed between the thin film transistor 20 and the light emitting device to provide a flat support surface for the light emitting device, to ensure uniformity of light emitted from the light emitting device.

Figure 5:
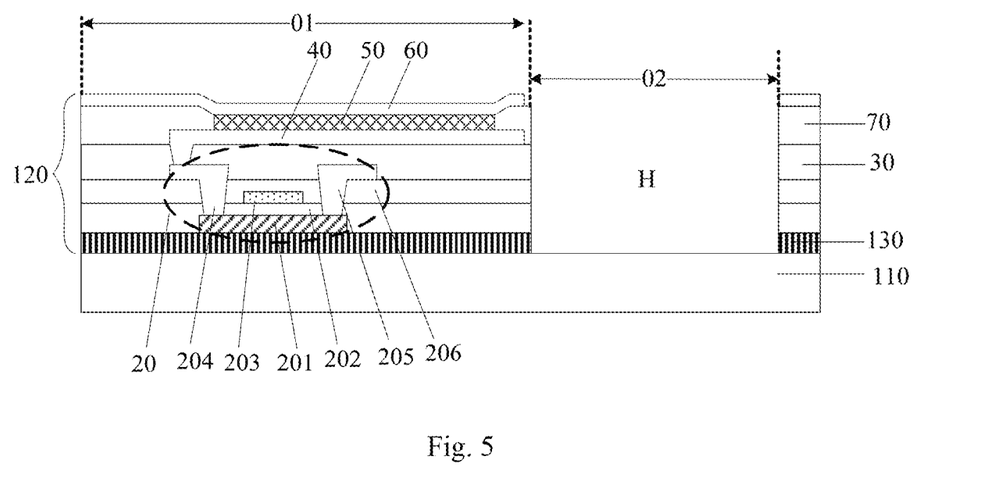
FIG. 5 is a schematic structural view of an OLED substrate provided by an embodiment of the present disclosure.

Further, as shown in FIG. 5, the display layer 120 may further comprise a buffer layer 130 disposed on the substrate 110, and the thin film transistor 20 and the light emitting device are disposed on the buffer layer 130. The buffer layer 130 can play the role of adjusting stresses, neutralizing charges, and the like.

Upon implementation, the first hollow part H of the display layer 120 may be formed by an etching process. The manufacturing process of the display layer 120 will be described in detail below based on an example in which the display layer 120 comprises the buffer layer 130, the thin film transistor 20, the planarization layer 30, and the light emitting device disposed on the substrate 110 successively.

As shown in FIG. 5, firstly, a buffer layer film is formed on the substrate 110 by, for example, a deposition process. Then, an active layer film is formed on the buffer layer film, and the active layer film is patterned to form an active layer 201. Next, a gate insulating layer film is formed on the active layer 201. A first conductive film is formed on the gate insulating layer film, and the first conductive film is patterned to form a gate 203. An interlayer dielectric layer film is formed on the gate 203, and portions of the interlayer dielectric layer film and the gate insulating layer film located in the light emitting region 01 are etched to form a first terminal contact hole and a second terminal contact hole. The interlayer dielectric layer film, the gate insulating layer film, and the buffer layer film located in the transparent region 02 are etched (for example, dry-etched) to form a portion of the first hollow part in the interlayer dielectric layer film, the gate insulating layer film, and the buffer layer film, to thereby form an interlayer dielectric layer 206, a gate insulating layer 202 and a buffer layer 130. Then, a second conductive film is formed on the interlayer dielectric layer 206. The second conductive film fills the first terminal contact hole and the second terminal contact hole, and the second conductive film is patterned to form a first terminal 205 and a second terminal 204. The first terminal 205 is connected to the active layer 201 via the first terminal contact hole, and the second terminal 204 is connected to the active layer 201 via the second terminal contact hole.

Next, a planarization film is formed on the first terminal 205 and the second terminal 204, the planarization film is patterned to form a via hole that exposes at least a portion of the second terminal 204, and to form a portion of the first hollow part in the planarization film in the transparent region 02, to form a planarization layer 30. A third conductive film is formed on the planarization layer 30, and the third conductive film is patterned to form an anode 40 which is electrically connected to the second terminal 204 through the via hole in the planarization layer 30. Then, a pixel defining layer film is formed on the anode 40, and the pixel defining layer film is patterned to form a pixel defining layer 70 which has an opening in the light emitting region 01 to expose the anode 40 of the light emitting device, and has a hollow part in the transparent region 02. A light emitting functional layer 50 and a fourth conductive film are formed successively in the opening of the pixel defining layer 70, and the fourth conductive film is patterned such that a portion of the fourth conductive film located in the transparent region 02 has a hollow part, and a cathode 60 of the light emitting device is formed.

In the above manufacturing process, the patterning of the active layer film, the first conductive film, the second conductive film, the third conductive film, the fourth conductive film, the planarization film, and the pixel defining layer film may include processes such as photoresist coating, exposure, development, etching, photoresist removal, and the like.

In the process of forming the display layer 120, an etching process needs to be used to form the first hollow part. If the display layer 120 is directly formed on the base substrate, when etching is being performed to form the display layer 120 comprising the first hollow part, the base substrate is easily over-etched, resulting in surface unevenness of the base substrate. The uneven surface of the base substrate 10 would scatter light incident thereon, thereby affecting the display effect of an OLED display.

Figure 6:
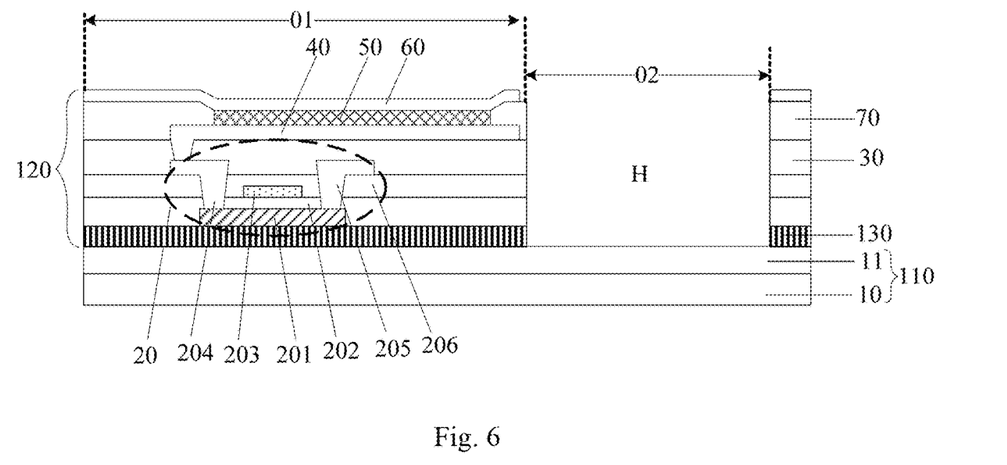
FIG. 6 is a schematic structural view of an OLED substrate provided by an embodiment of the present disclosure.

On this basis, in an exemplary embodiment of the present disclosure, as shown in FIG. 6, the substrate 110 comprises a base substrate 10 and a transparent etch barrier layer 11 located between the base substrate 10 and the display layer 120. The etch barrier layer 11 may be configured to block etching, that is, during etching, when etching proceeds to the etch barrier layer 11, the etching process stops automatically.

The material of the etch barrier layer 11 is not limited as long as it is capable of blocking etching during the etching process. For example, the material of the etch barrier layer 11 may be ITO (Indium Tin Oxide) and/or IZO (Indium Zinc Oxide). Here, since the etch barrier layer 11 is transparent, it does not affect the transmission of light.

In the above embodiment, the substrate 110 comprises the base substrate 10 and the etch barrier layer 11. Since the etch barrier layer 11 can block etching during the process of etching the display layer 120, the surface of the substrate 110 can be kept flat, thereby effectively avoiding light scattering.

Figure 7:
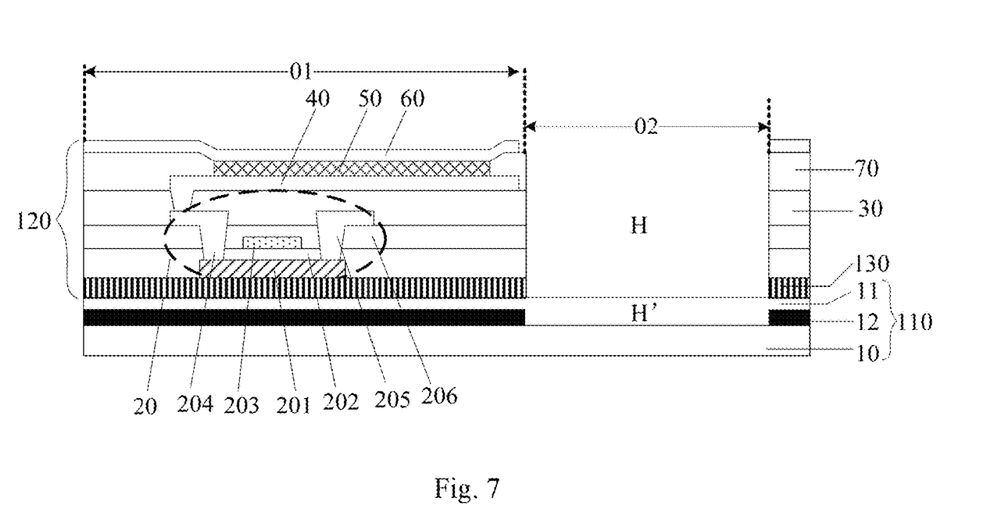
FIG. 7 is a schematic structural view of an OLED substrate provided by an embodiment of the present disclosure.
Figure 8:
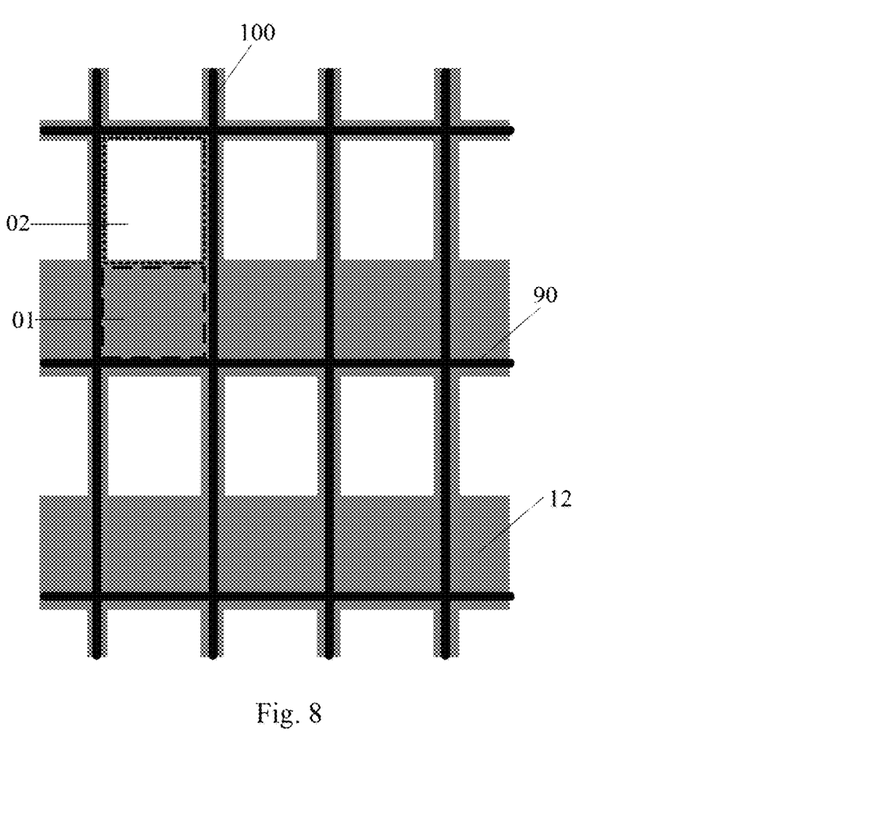
FIG. 8 is a schematic structural view of an OLED substrate provided by an embodiment of the present disclosure.

In an exemplary embodiment, as shown in FIGS. 7 and 8, the substrate 110 comprises a base substrate 10 and a light shielding layer 12 located between the base substrate 10 and the display layer 120. A portion of the light shielding layer 12 located in the transparent region 02 has a second hollow part H'.

Here, the material of the light shielding layer 12 is not limited as long as it is capable of shielding light. For example, the material of the light shielding layer 12 may be a black resin, a metal or the like. Since the thin film transistor 20 and the light emitting device need to be subjected to high-temperature treatment during the manufacturing process, and the metal is generally high temperature-resistant, embodiments of the present disclosure may advantageously employ a metal material as the material of the light shielding layer 12. However, in case the material of the light shielding layer 12 is a metal material, induced charges are easily generated on the light shielding layer 12, which may cause the voltage of the thin film transistor 20 to be unstable (floating). Therefore, in the case where the material of the light shielding layer 12 is a metal material and the substrate 110 comprises the etch barrier layer 11, the material of the etch barrier layer 11 may be advantageously selected as a transparent conductive material. Since the etch barrier layer 11 has electrical conductivity, it is possible to connect the etch barrier layer 11 to the wirings on the OLED substrate and apply a fixed voltage to the wirings, to ensure that the light shielding layer 12 and the etch barrier layer 11 have stable voltages, which in turn avoids the phenomenon that the light shielding layer 12 and the etch barrier layer 11 cause the voltage of the thin film transistor 20 to be unstable.

On this basis, when the material of the etch barrier layer 11 is a transparent conductive material, the material of the etch barrier layer 11 may be selected from at least one of ITO or IZO.

Upon implementation, a light shielding film may be formed on the base substrate 10, and then the light shielding film is patterned to form the light shielding layer 12.

In an exemplary embodiment, the orthographic projection of the first hollow part H on the base substrate 10 at least partially overlaps that of the second hollow part H' on the base substrate 10. For example, the orthographic projection of the second hollow part on the base substrate 10 coincides with that of the first hollow part on the base substrate 10. Alternatively, the orthographic projection of the second hollow part on the base substrate 10 is located within that of the first hollow part on the base substrate 10. Alternatively, the orthographic projection of the first hollow part on the base substrate 10 is located within that of the second hollow part on the base substrate 10.

Figure 9:
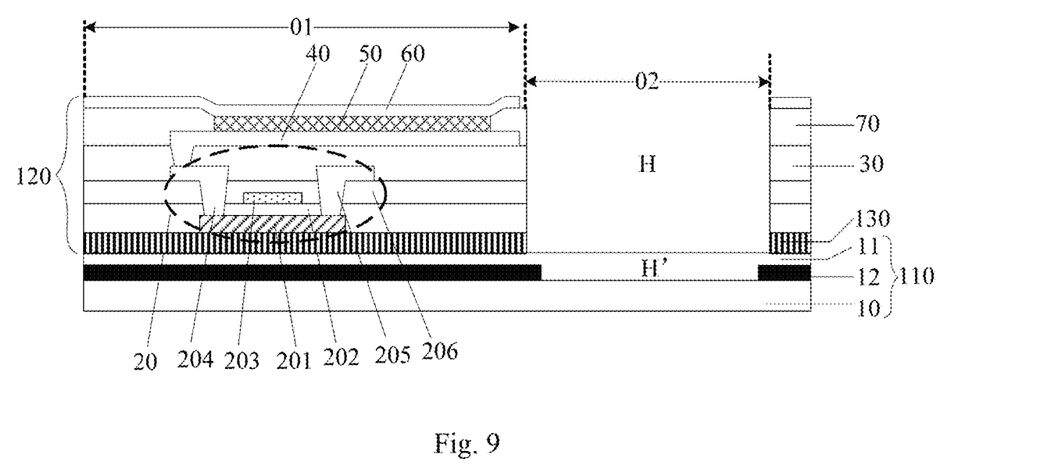
FIG. 9 is a schematic structural view of an OLED substrate provided by an embodiment of the present disclosure.

Inventors of the present disclosure have found that, when images are being acquired through the transparent region 02, an interference phenomenon occurs when light is incident on the edge of the first hollow part of the display layer 120, so that bright spots will appear in the images acquired through the transparent region 02. Therefore, advantageously, as shown in FIG. 9, it is possible to make the orthographic projection of the second hollow part H' on the base substrate 10 located within that of the first hollow part H on the base substrate 10. In this way, when images are being acquired through the transparent region 02, the light shielding layer 12 can prevent light from being incident on the edge of the first hollow part H of the display layer 120, thereby avoiding the interference phenomenon occurring to light incident on the edge of the first hollow part H of the display layer 120.

Typically, the OLED substrate is provided with a plurality of wirings, such as gate lines 90, data lines 100, control lines, and the like. Since the wirings on the OLED substrate are very dense, it is easy to cause an optical interference phenomenon, which in turn directly affects the clarity of imaging. In an embodiment of the present disclosure, since the substrate 110 comprises the light shielding layer 12 disposed on the base substrate 10, and the light shielding layer 12 can shield light to prevent light from being incident on the wirings, the optical interference phenomenon resulting from the dense wirings can be avoided. In case the OLED substrate is applied to an OLED transparent display, the definition of the OLED transparent display can be improved. Further, the light shielding layer 12 can also prevent light from being incident on the active layer 201, thereby ensuring stable performance of the thin film transistor 20.

Here, when the substrate 110 comprises the base substrate 10, the etch barrier layer 11 and the light shielding layer 12, the etch barrier layer 11 may be disposed between the base substrate 10 and the light shielding layer 12, or the light shielding layer 12 may be disposed between the etch barrier layer 11 and the base substrate 10. When the orthographic projection of the second hollow part on the base substrate 10 is located within that of the first hollow part on the base substrate 10, in order to prevent the portion of the light shielding layer 12 that is exposed by the first hollow part H from being etched during the etching process for forming the display layer 120, optionally, as shown in FIG. 9, the light shielding layer 12 may be disposed between the etch barrier layer 11 and the base substrate 10.

Figure 10:
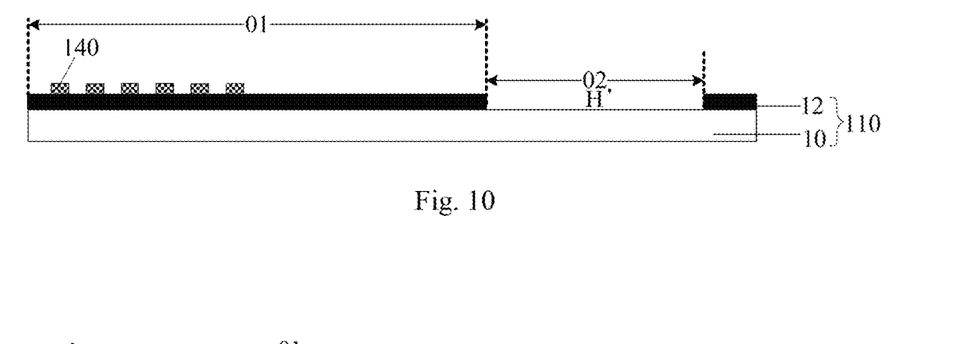
FIG. 10 is a schematic structural view of an OLED substrate provided by an embodiment of the present disclosure.

An embodiment of the present disclosure further provides an OLED substrate comprising, as shown in FIG. 10, a light emitting region 01 and a transparent region 02. The OLED substrate comprises a substrate 110 and wirings 140 on the substrate 110. The substrate 110 comprises a base substrate 10 and a light shielding layer 12 on the base substrate 10, wherein a portion of the light shielding layer 12 located in the transparent region 02 has a second hollow part H'.

Here, the type of the wirings 140 on the OLED substrate is not limited, and they may be the gate lines 90, the data lines 100, the control lines, and the like.

The material of the light shielding layer 12 is not limited, as long as it is capable of shielding light. For example, the material of the light shielding layer 12 may be a black resin or a metal, etc. Since the thin film transistor 20 and the light emitting device disposed on the OLED substrate need to be subjected to high-temperature treatment during the manufacturing process, and the metal is high temperature-resistant, the material of the light shielding layer 12 in embodiments of the present disclosure can be selected as a metal material.

Since the wirings on the OLED substrate are very dense, it is easy to cause an optical interference phenomenon, which in turn directly affects the clarity of imaging. In an embodiment of the present disclosure, since the OLED substrate comprises the substrate 110 and the wirings 140 disposed on the substrate 110, and the substrate 110 comprises the light shielding layer 12 disposed on the base substrate 10, the light shielding layer 12 can shield light to prevent light from being incident on the wirings 140, so that the optical interference phenomenon resulting from the dense wirings 140 can be avoided. In case the above OLED substrate is applied to an OLED transparent display, the definition of the OLED transparent display can be improved.

Figure 11:
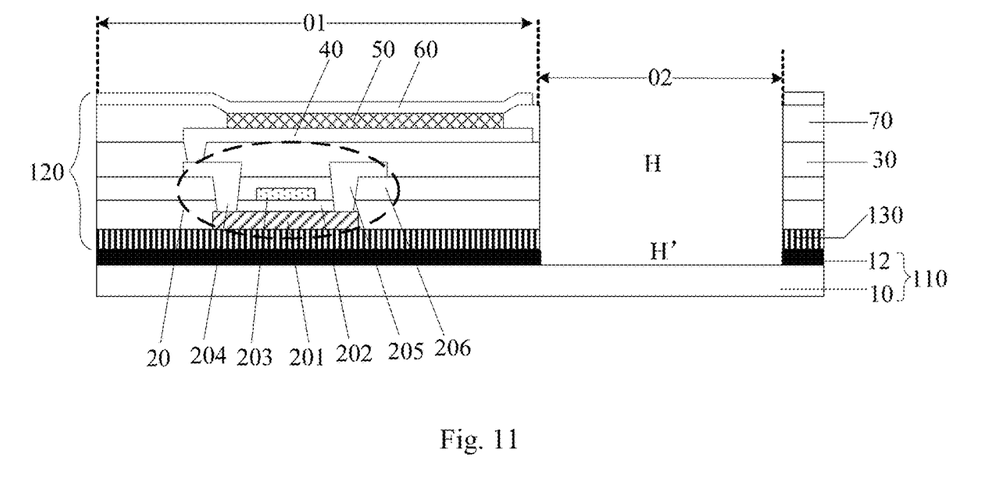
FIG. 11 is a schematic structural view of an OLED substrate provided by an embodiment of the present disclosure.
Figure 12:
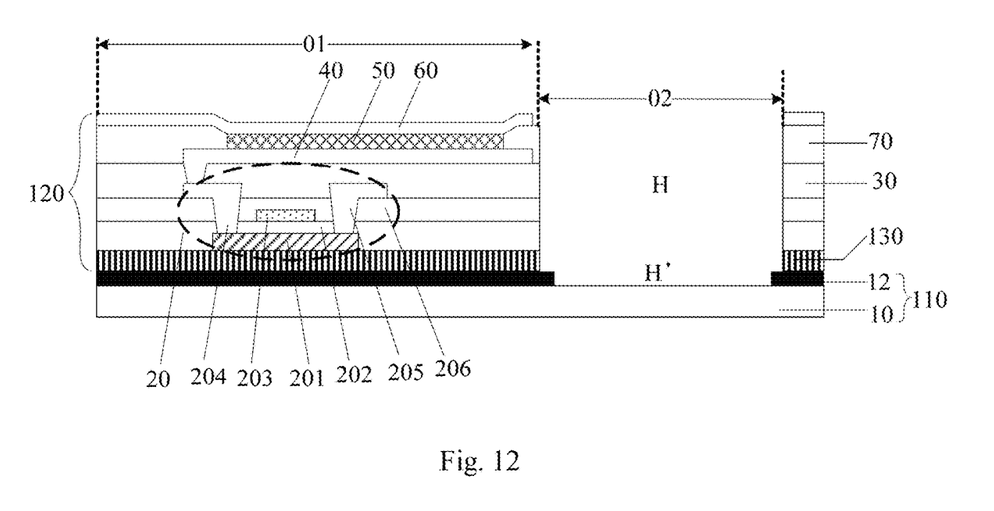
FIG. 12 is a schematic structural view of an OLED substrate provided by an embodiment of the present disclosure.

In an exemplary embodiment, as shown in FIG. 11 (the wirings 140 are not illustrated in FIG. 11), the OLED substrate comprises a display layer 120 disposed on the substrate 110, and a portion of the display layer 120 located in the transparent region 02 has a first hollow part H.

Specifically, as shown in FIG. 11, the display layer 120 may include, but is not limited to, a thin film transistor 20, a light emitting device, and a pixel defining layer 70. The thin film transistor 20 comprises an active layer 201, a gate insulating layer 202, a gate 203, an interlayer dielectric layer 206, a first terminal 205, and a second terminal 204. The second terminal 204 and the first terminal 205 are both connected to the active layer. The pixel defining layer 70 has a plurality of openings such that the light emitting device is disposed in a respective one of the openings. The light emitting device comprises an anode 40, a cathode 60, and a light emitting functional layer 50 sandwiched between the anode 40 and the cathode 60. The second terminal 204 of the thin film transistor 20 is electrically connected to the anode 40 of the light emitting device, thereby driving the light emitting device to emit light. The light emitting functional layer 50 of the light emitting device comprises a light emitting layer, and optionally, at least one of an electron transport layer, an electron injection layer, a hole transport layer, and a hole injection layer.

Further, as shown in FIG. 11, the display layer 120 may further comprise a planarization layer 30 disposed between the thin film transistor 20 and the light emitting device to provide a flat support surface for the light emitting device, ensuring uniformity of light emitted from the light emitting device.

Further, as shown in FIG. 11, the display layer 120 may further comprise a buffer layer 130 disposed on the substrate 110, and the thin film transistor 20 and the light emitting device are disposed on the buffer layer 130. The buffer layer 130 can play the role of adjusting stresses, neutralizing charges, and the like.

Upon implementation, the wirings 140 may be formed simultaneously with one or more layers of the display layer 120.

In the above-described OLED substrate provided by an embodiment of the present disclosure, since the portion of the display layer 120 located in the transparent region 02 has the first hollow part H, loss of light caused by the display layer 120 when the light passes through the first hollow part is avoided, so that the transmittance of light when the light passes through the transparent region 02 of the OLED substrate can be enhanced. In case the above-described OLED substrate is applied to an OLED transparent display, the light transmittance of the transparent display is enhanced, which increases the brightness of an image acquired through the transparent region, thereby improving the user experience.

In an exemplary embodiment, the orthographic projection of the first hollow part H on the base substrate 10 at least partially overlaps that of the second hollow part H' on the base substrate 10. For example, the orthographic projection of the second hollow part H' on the base substrate 10 coincides with that of the first hollow part H on the base substrate 10. Alternatively, the orthographic projection of the second hollow part H' on the base substrate 10 is located within that of the first hollow part H on the base substrate 10. Alternatively, the orthographic projection of the first hollow part H on the base substrate 10 is located within that of the second hollow part H' on the base substrate 10.

Inventors of the present disclosure have found that, when images are being acquired through the transparent region 02, an interference phenomenon occurs when light is incident on the edge of the first hollow part H of the display layer 120, so that bright spots will appear in the images acquired through the transparent region 02. Therefore, advantageously, as shown in FIG. 9, it is possible to make the orthographic projection of the second hollow part H' on the base substrate 10 located within that of the first hollow part H on the base substrate 10. In this way, when images are being acquired through the transparent region 02, the light shielding layer 12 can prevent light from being incident on the edge of the first hollow part of the display layer 120, thereby avoiding the interference phenomenon occurring to light incident on the edge of the first hollow part of the display layer 120.

Optionally, as shown in FIG. 9, the substrate 110 further comprises a transparent etch barrier layer 11 disposed between the base substrate 10 and the display layer 120.

Specifically, the etch barrier layer 11 may be disposed between the base substrate 10 and the light shielding layer 12, or the light shielding layer 12 may be disposed between the etch barrier layer 11 and the base substrate 10. When the orthographic projection of the second hollow part on the base substrate 10 is located within that of the first hollow part on the base substrate 10, in order to prevent the portion of the light shielding layer 12 that is exposed by the first hollow part from being etched during the etching process for forming the display layer 120, optionally, as shown in FIG. 9, the light shielding layer 12 may be disposed between the etch barrier layer 11 and the base substrate 10.

Here, the material of the etch barrier layer 11 is not limited as long as it is capable of blocking etching during the etching process. In an exemplary embodiment, when the material of the light shielding layer 12 is a metal material, induced charges are easily generated on the light shielding layer 12, and the induced charges may cause the voltage of the thin film transistor 20 to be unstable. Therefore, in the case where the material of the light shielding layer 12 is a metal material and the substrate 110 comprises the etch barrier layer 11, optionally, the material of the etch barrier layer 11 may be a transparent conductive material. Since the etch barrier layer 11 has electrical conductivity, it is possible to connect the etch barrier layer 11 to the wirings and apply a fixed voltage to the wirings, to ensure that the light shielding layer 12 and the etch barrier layer 11 have stable voltages, thereby avoiding the problem that the light shielding layer 12 and the etch barrier layer 11 cause the voltage of the thin film transistor 20 to be unstable. On this basis, when the material of the etch barrier layer 11 is a transparent conductive material, the material of the etch barrier layer 11 may be selected from at least one of ITO or IZO.

In the above embodiment of the present disclosure, since the substrate 110 comprises the etch barrier layer 11, the etch barrier layer 11 can prevent etching from proceeding to the substrate 110 during the process of etching the display layer 120, so that the surface of the substrate 110 remains flat and light scattering is avoided.

Figure 13:
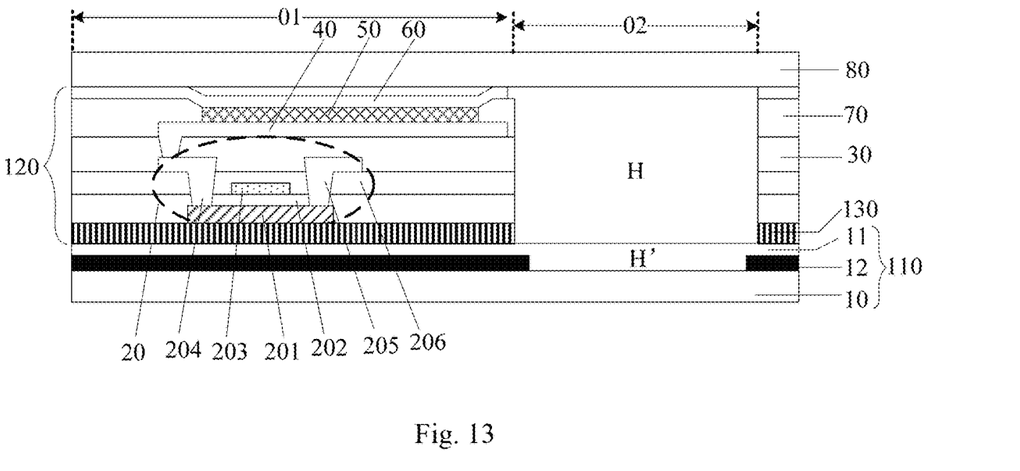
FIG. 13 is a schematic structural view of a transparent display provided by an embodiment of the present disclosure.
Figure 14:
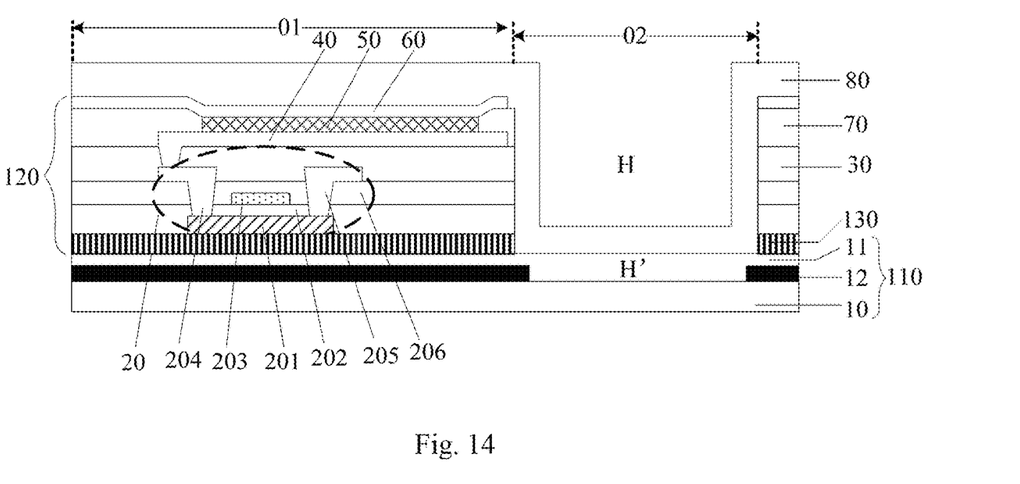
FIG. 14 is a schematic structural view of another transparent display provided by an embodiment of the present disclosure.

Further, an embodiment of the present disclosure provides a transparent display comprising, as shown in FIGS. 13 and 14, any of the OLED substrates described above and a package layer 80 for packaging the OLED substrate.

The package layer 80 may be a substrate package layer as shown in FIG. 13. Alternatively, the package layer 80 may also be a thin film package layer as shown in FIG. 14.

The transparent display may be any device that displays an image regardless of being moving (e.g., video) or fixed (e.g., still image) and regardless of being textual or graphic. More specifically, it is contemplated that the above-described embodiments can be implemented in or associated with a variety of electronic devices including, but not limited to, a mobile phone, a wireless device, a personal data assistant (PDA), a handheld or portable computer, a GPS receiver/navigator, a camera, an MP4 video player, a camera, a game console, a watch, a clock, a calculator, a TV monitor, a tablet display, a computer monitor, an automobile display (e.g., a mileage table display, etc.), a navigator, a cockpit controller and/or display, a camera view display (e.g., a display of a rear view camera in a vehicle), an electronic photo, an electronic billboard or signage, a projector, a building structure, a packaging and aesthetic structure (e.g., a display for an image of a piece of jewelry), and the like. In addition, the transparent display provided by the embodiment of the present disclosure may also be a transparent display panel.

An embodiment of the present disclosure provides a transparent display. When the portion of the display layer 120 of the OLED substrate in the transparent display which is located in the transparent region 02 has a first hollow part, since loss of light caused by the display layer 120 when the light passes through the first hollow part is avoided, the light transmittance of the transparent display is enhanced when light passes through the transparent region 02 of the transparent display, which increases the brightness of an image acquired through the transparent region 02, thereby improving the user experience. Further, when the OLED substrate in the transparent display comprises the substrate 110 and the wirings 140 disposed on the substrate 110, the substrate 110 comprises the base substrate 10 and the light shielding layer 12 disposed on the base substrate 10, and the portion of the light shielding layer 12 located in the transparent region 02 has a second hollow part, such that the optical interference phenomenon caused by the dense wirings 140 is avoided because the light shielding layer 12 can shield light to prevent the light from being incident on the wirings 140, thereby improving the definition of the OLED transparent display.

In the transparent display provided by the embodiment of the present disclosure, the base substrate 10 of the OLED substrate may be a rigid substrate or a flexible substrate. When the base substrate 10 is a flexible substrate, the base substrate 10 may be attached to a rigid substrate (such as a glass substrate), and then the display layer 120, the light shielding layer 12, or the etch barrier layer 11, etc. may be formed on the base substrate 10. After the transparent display has been manufactured, the base substrate 10 is peeled off the rigid substrate, thereby obtaining a flexible transparent display. In particular, the material of the flexible substrate may be, for example, polyimide.

What have been described above are merely specific embodiments of the present disclosure, but the scope of the present disclosure is not limited so. Any variations or substitutions that can be readily conceived by a skilled person familiar with this technical field within the technical scope revealed by the present disclosure shall be encompassed within the scope of the present disclosure. Thus, the scope of the present disclosure shall be determined by the scope of the appended claims.

What is claimed is:

1. A display substrate comprising:
a light emitting region; and
a transparent region,
wherein the display substrate comprises a base substrate and a display layer on the base substrate,
wherein a light shielding layer is located between the base substrate and the display layer, and
wherein an orthographic projection of the display layer on the base substrate is at least partially located within an orthographic projection of the light shielding layer on the base substrate.

2. The display substrate according to claim 1,
wherein the display layer comprises wirings, and
wherein an orthographic projection of the wirings on the base substrate is at least partially located within the orthographic projection of the light shielding layer on the base substrate.

3. The display substrate according to claim 2, wherein the wirings are formed of a same material in a same layer as at least one layer of the display layer.

4. The display substrate according to claim 2,
wherein the wirings comprise a plurality of gate lines, and
wherein an orthographic projection of the plurality of gate lines on the base substrate is located within the orthographic projection of the light shielding layer on the base substrate.

5. The display substrate according to claim 2,
wherein the wirings comprise a plurality of data lines, and
wherein an orthographic projection of the plurality of data lines on the base substrate is located within the orthographic projection of the light shielding layer on the base substrate.

6. The display substrate according to claim 2,
wherein the wirings comprise a plurality of control lines, and
wherein an orthographic projection of the plurality of control lines on the base substrate is located within the orthographic projection of the light shielding layer on the base substrate.

7. The display substrate according to claim 2, further comprising:
a transparent etch barrier layer located between the wirings and the light shielding layer.

8. The display substrate according to claim 7,
wherein the light shielding layer comprises a metal layer, and
wherein the transparent etch barrier layer comprises a transparent conductive layer.

9. The display substrate according to claim 1, wherein the light shielding layer comprises one or more of a black resin layer or a metal layer.

10. The display substrate according to claim 1,
wherein the display layer comprises a buffer layer, a thin film transistor, a planarization layer, a light emitting device, and a pixel defining layer in sequence on the base substrate, and
wherein the light shielding layer is between the buffer layer and the base substrate.

11. The display substrate according to claim 1,
wherein the display substrate comprises a plurality of pixel units arranged in a matrix,
wherein each pixel unit of the plurality of pixel units comprises at least one sub-pixel unit,
wherein each sub-pixel unit of the at least one sub-pixel unit comprises a light emitting sub-region and a transparent sub-region, and
wherein all light emitting sub-regions constitute the light emitting region, and all transparent sub-regions constitute the transparent region.

12. The display substrate according to claim 1,
wherein the display substrate comprises a plurality of pixel units arranged in a matrix,
wherein each pixel unit of the plurality of pixel units comprises at least one sub-pixel unit,
wherein all sub-pixel units constitute the light emitting region, and
wherein regions among the plurality of pixel units constitute the transparent region.

13. The display substrate according to claim 1, wherein an orthographic projection of the transparent region on the base substrate is located outside of the orthographic projection of the light shielding layer on the base substrate.

14. A display device comprising the display substrate according to claim 1 and a package layer on the display substrate.

15. The display device according to claim 14, wherein the package layer comprises one of a substrate package layer or a thin film package layer.

16. The display device according to claim 14,
wherein the display layer comprises wirings, and
wherein an orthographic projection of the wirings on the base substrate is located within the orthographic projection of the light shielding layer on the base substrate.

17. The display device according to claim 16, wherein the wirings are formed of a same material in a same layer as at least one layer of the display layer.

18. The display device according to claim 16,
wherein the wirings comprise a plurality of gate lines, and
wherein an orthographic projection of the plurality of gate lines on the base substrate is located within the orthographic projection of the light shielding layer on the base substrate.

19. The display device according to claim 16,
wherein the wirings comprise a plurality of data lines, and
wherein an orthographic projection of the plurality of data lines on the base substrate is located within the orthographic projection of the light shielding layer on the base substrate.

20. A transparent display comprising the display substrate according to claim 1 and a package layer on the display substrate.

* * * * *